(12) United States Patent
Mo et al.

(10) Patent No.: US 7,363,606 B1
(45) Date of Patent: Apr. 22, 2008

(54) FLIP-FLOP INSERTION METHOD FOR GLOBAL INTERCONNECT PIPELINING

(75) Inventors: Yu-yen Mo, San Jose, CA (US); Manoj Gopalan, Milpitas, CA (US); Venkat R. Podduturi, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 98 days.

(21) Appl. No.: 11/211,003

(22) Filed: Aug. 23, 2005

(51) Int. Cl.
*G06F 9/45* (2006.01)
*G06F 17/50* (2006.01)

(52) U.S. Cl. .................................. 716/6; 716/2; 716/10

(58) Field of Classification Search ................ 716/4–6, 716/8–10; 703/14, 19
See application file for complete search history.

(56) References Cited

U.S. PATENT DOCUMENTS

| | | | |
|---|---|---|---|
| 6,286,128 B1 * | 9/2001 | Pileggi et al. ................. | 716/18 |
| 6,910,196 B2 * | 6/2005 | Cocchini ....................... | 716/6 |
| 6,925,625 B2 * | 8/2005 | Kim ............................. | 716/10 |
| 6,931,614 B2 * | 8/2005 | Jung et al. .................... | 716/10 |
| 6,973,632 B1 * | 12/2005 | Brahme et al. ................ | 716/6 |
| 7,072,815 B1 * | 7/2006 | Chaudhary et al. ........... | 703/13 |
| 2004/0025134 A1 * | 2/2004 | Jung et al. .................... | 716/13 |
| 2004/0153984 A1 * | 8/2004 | Akkiraju ........................ | 716/6 |
| 2005/0062496 A1 * | 3/2005 | Gidon et al. .................. | 326/40 |
| 2005/0132316 A1 * | 6/2005 | Suaris et al. .................. | 716/11 |

* cited by examiner

*Primary Examiner*—Paul Dinh
*Assistant Examiner*—Nha Nguyen
(74) *Attorney, Agent, or Firm*—Martine Penilla & Gencarella, LLP

(57) ABSTRACT

A method for inserting flip-flops in an interconnect is provided such that a cycle time constraint for the interconnect is satisfied. First of all, a flop is inserted at an initial placement at a node along a signal path of the interconnect such that a downstream delay relative to the initial placement of the flop is not greater than the cycle time constraint for the net. Secondly, the initial placement of the flop is optimized such that a delay difference, defined by a downstream delay minus an upstream delay, relative to an optimal placement at a downstream node along the signal path of the net is not greater than zero. The disclosed method can also satisfy the flop stage requirement and/or a minimum number of flops requirement for an interconnect.

11 Claims, 6 Drawing Sheets

FLIP-FLOP INSERTION METHOD FOR GLOBAL INTERCONNECT PIPELINING

BACKGROUND

1. Field of the Invention

The present invention relates generally to delay reduction for global interconnect by introducing pipelining, and more particularly, to methods for reducing the signal delay violation of clock cycle for signals distributed over long distances between logic blocks of an integrated circuit design.

2. Description of the Related Art

As the scale of integrated circuits continue to grow and the features of process technology continue to shrink, coupled with ever increasing clock frequency, timing has become a more and more dominating factor in global interconnect design. Circuit designers usually use proper planning in logic synthesis, physical floor layout, and calculated placement to ensure that signals at the global integration level can reach their destination within the clock period. However, this may not be possible with new designs using higher clock frequency and new process technology.

Repeater insertion is extensively used to reduce signal delays for interconnects, especially when signals are distributed over long distances on a chip. However, as the signal paths of a global interconnect become longer, the number of repeaters needed for the global interconnect increases. When the number of repeaters inserted for a global interconnect is more than an optimal number, the excessive number of repeaters will cause additional signal delays for the global interconnect due to the intrinsic delay of repeaters, which is undesired.

In order to overcome the repeater delay problems in a global interconnect, a method of concurrent flip-flop (flop) and repeater insertion that uses generalized delay models and multiple types of repeaters and flops was proposed. This method uses flops as clocked repeaters to avoid negative slack during the computation. However, this method does not effectively address the need if the number of flops between any given driver-receiver pair is constrained.

In view of the foregoing, there is a need for a method of flop insertion that will shorten the flop-to-flop signal path in order for signals to meet a cycle time constraint along with a flop stage requirement for the signal path of an interconnect.

SUMMARY

Broadly speaking, the present invention fills this need by providing a method for inserting flip-flop (flop) in an interconnect (net) between logic blocks of an integrated circuit design to ensure that a cycle time constraint for the net is satisfied.

In accordance with one aspect of the present invention, a method for inserting flop in a net to satisfy a cycle time constraint for the net is provided. The method initiates with inserting a flop at an initial placement at a node along a signal path of the net such that a downstream delay relative to the initial placement of the flop along the signal path of the net is not greater than the cycle time constraint for the net. Thereafter, the initial placement of the flop is optimized such that a delay difference, defined by a downstream delay minus an upstream delay, relative to an optimal placement at a downstream node along the signal path of the net is not greater than zero.

In accordance with another aspect of the present invention, a method for inserting flops in a net such that a cycle time constraint and each flop stage requirement for each signal path of the net are satisfied. The method starts with inserting flops at initial placements along each signal path of the net such that each downstream delay relative to each initial placement of each flop along each signal path of the net is not greater than the cycle time constraint for the net, and the number of flops inserted at each signal path satisfies each flop stage requirement for each signal path of the net. The initial placements of the inserted flops are optimized such that each delay difference, defined by a downstream delay minus an upstream delay, relative to each optimal placement along each signal path of the net is not greater than zero.

In accordance with a further aspect of the present invention, a method for inserting flops in a net such that a cycle time constraint, the flop stage constraints, and a minimum number of flops requirement for the net are satisfied. The method starts with inserting flops at initial placements along each signal path of the net such that each downstream delay relative to each initial placement of each flop along each signal path of the net is not greater than the cycle time constraint for the net. The initial placements of the inserted flops are optimized such that each delay difference, defined by a downstream delay minus an upstream delay, relative to each optimal placement along each signal path of the net is not greater than zero.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
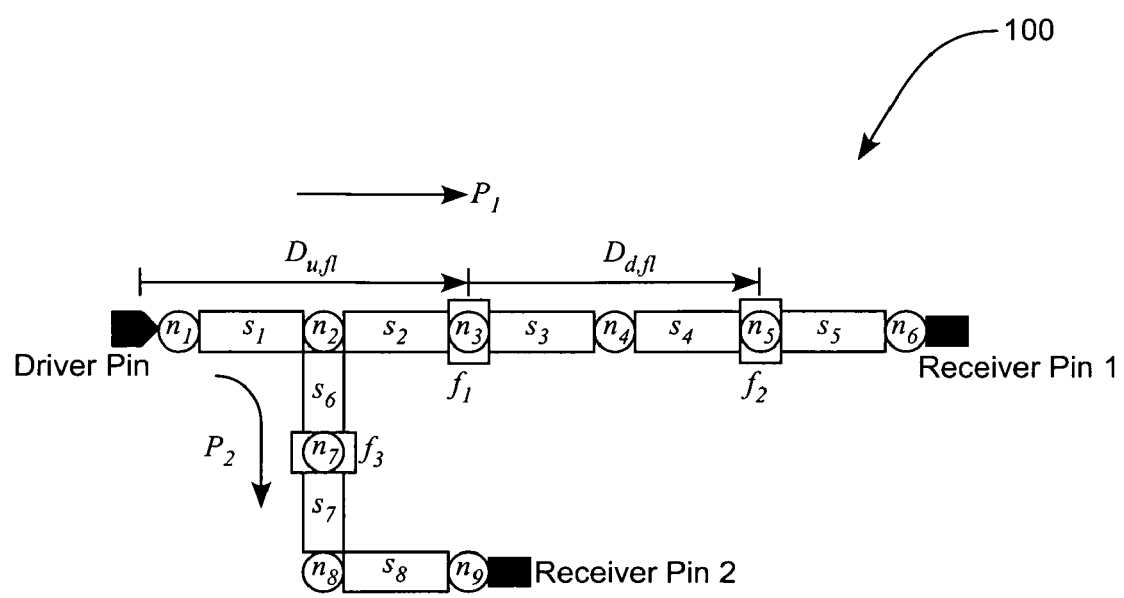
FIG. 1 is a schematic diagram representing an interconnect (net) with flip-flop (flop) insertions in accordance with one embodiment of the present invention.

FIG. 1 is a schematic diagram representing an interconnect (net) 100 with flip-flop (flop) insertions in accordance with one embodiment of the present invention. The interconnect 100, i.e., the global interconnect 100 or the net 100, comprises a driver pin, two receiver pins, nine nodes, and eight segments. The net 100 starts from the Driver Pin, branches out from a fan-out node $n_2$, and ends at the Receiver Pin 1 and the Receiver Pin 2, respectively. The path from the Driver Pin to the Receiver Pin 1 is the signal path $P_1$, while the path from the Driver Pin to the Receiver Pin 2 is the signal path $P_2$. As shown in FIG. 1, $f_1$, $f_2$, and $f_3$ represent three flops respectively inserted at the nodes $n_3$, $n_5$, and $n_7$ in the net 100. The notations in FIG. 1 are explained below:

Segment (s)—Wires $\{s_1, s_2, \ldots s_8\}$ between any two nodes.

Node (n)—Candidate locations $\{n_1, n_2, \ldots, n_9\}$ where a flop can be inserted. Candidate locations can be determine by space availability and minimum length requirements. However, adequate number of candidate locations must be given to an interconnect in order to generate a valid flop insert solution, especially when the required flop stages vary among different signal paths. The more the candidate locations available, the better the solution quality, the longer the running time. Assume each fan-out node, such as node ($n_2$) in FIG. 1, is also a candidate location that drives all downstream branches, which comprise segments $\{s_6, s_7, s_8\}$ and $\{s_2, s_3, s_4, s_5\}$. The node located at the driver pin is a driver node, node $n_1$. The nodes located at the receiver pins are receiver nodes, nodes $n_6$ and $n_9$.

Parent Net—The original net that comprises all of the segments $\{s_1, s_2 \ldots, s_8\}$ and nodes $\{n_1, n_2 \ldots, n_9\}$ in FIG. 1.

Child Net—A subset of segments of the parent net as a result of flop insertions. Each of the following sets is a child net: $\{s_1, s_2, s_6\}$, $\{s_3, s_4\}$, $\{s_5\}$, $\{s_7, s_8\}$. The nodes inside a child net are called child node: $\{n_2\}$, $\{n_4\}$, $\{n_8\}$.

Branch (b)—Segment(s) between a driver/receiver node and a fan-out node, a fan-out node and another fan-out node, or a driver/receiver node and another driver/receiver node (if no fan-out node in between) in the parent net. Each of the following set is a branch for the parent net: $\{s_1\}$, $\{s_2, s_3, s_4, s_5\}$, $\{s_6, s_7, s_8\}$.

Signal Path (p)—Segment(s) between a driver node and a receiver node in the parent net. Each of the following sets is a signal path $p_1=\{s_1, s_2, s_3, s_4, s_5\}$, $p_2=\{s_1, s_6, s_7, s_8\}$.

Flop Stage (G)—The number of flops required for a signal path. In FIG. 1, $G_{p1}=2$, $G_{p2}=1$. This is an user input.

Current Flop Stage (g)—The number of flops currently has been inserted into a partial signal path that is at the downstream of a node. This is a segment attribute.

Flop Stage Deficiency (d)—The difference between the required number of flops (flop stage) and the current number of flops (current flop stage) in a partial signal path. $d=G-g$. This is a segment attribute.

Upstream—The direction towards the driver pin of the parent net (the direction where the signal is coming from).

Downstream—The direction towards the receiver pin(s) of the parent net. A fan-out node has multiple downstream branches (the direction where the signal is going to).

Upstream Delay ($D_u$)—The maximum delay for a child net that connects to the input of a flop. Note that the upstream delay may not be the delay of the signal path to the input pin of the flop, if the child net has multiple receiver pins.

Downstream Delay ($D_d$)—The maximum delay for a child net that connects to the output of a flop.

The required number of clock cycles that a net needs to deliver its signal is defined as a cycle time constraint for the net. For each signal path of a net, a flop stage requirement can also be specified. If flop stage requirements are not given for the signal paths of a net, the claimed invention described below will generate a minimum number of flops needed for the net to meet its cycle time constraint.

The main goal of flop insertions for a net is to shorten the flop-to-flop signal travel time in order for signals to meet required cycle time constraint. All child nets formed after flop insertion need to have zero or positive slack (required time-arrival time). Additionally, positive slack after flop insertion should be distributed to all child nets as much as possible to enhance signal quality.

Given above design goals, the embodiments of the claimed invention are capable of solving the following three problems:

PROBLEM P1: Insert minimum number of flops into a net.

Objective: minimize the number of flops needed to be inserted into a net.

Sub-objective: balance the slack in all child nets (maximize the minimum slack for all child nets).

Constraints:
1. All child nets formed after the flop insertion need to have zero or positive slack.
2. User can define flop stage differences for different signal paths within a net (e.g. Gp1=Gp2+1, the number of flops may increase with this additional constraint).

PROBLEM P2: Insert pre-defined number of flops (flop stages) into a net.

Objective: balance the slack in all child nets (maximize the minimum slack for all child nets).

Constraint:

User defined flop stage from the driver pin to each receiver pin must be honored. Requirements:
1. The required number of flops (flop stages) from the driver pin to each receiver pin can vary in the same net.
2. The number of flops required for a driver-receiver path can be zero or more.

PROBLEM P3: Insert pre-defined number of flops (flop stages) with minimum number of flops requirement for a net (i.e. In the net 100, as shown in FIG. 1, the most slack balanced solution may require more flops than the flop insertion solution that uses the minimum number of flops. In the example, the minimum number of flops that can be used to satisfy the flop stage constraint is 2 and the maximum number of flops is 4).

Objective: minimize the number of flops needed to be inserted into a net.

Sub-objective: balance the slack in all child nets (maximize the minimum slack for all child nets).

Constraint:

User defined number of flops (flop stages) from the driver pin to each receiver pin must be honored.

Requirements:
1. The required number of flops from the driver pin to each receiver pin can vary in the same net.
2. The number of flops required for a driver-receiver path can be zero or more.

The following provides additional exemplary requirements:

(1). Only one type flops (same driving strength and input load) is used in a given net.

(2). Repeater insertion will be taking into account when analyzing the timing for the solution of flop insertion. Since repeater insertion can make delay increase near linearly with respect to wire length, we can use wire length for delay estimation to speed-up the algorithm if the solution accuracy is acceptable.

In the case of multiple types of flops provided for a given net, multiple copies of data can be kept for each type of flops at each node, as long as the multiple types of flops are not mixed. After multiple sets of initial solutions are constructed for the net, a flop type that gives the best initial solution can be chosen.

The claimed method comprises two phases. In phase one of the claimed method, a valid initial solution, i.e., the solution of initial flop placements, is constructed bottom-up (from a receiver node to a driver node), based on the required cycle time and flop stage constraints. If a valid initial solution cannot be obtained for the cycle time constraint, the cycle time constraint cannot be met for the given net. However, the required cycle time constraint can be relaxed to obtain the best possible solution if desired. If there is no flop stage constraint for a net, phase one can also be used to determine the minimum number of flops needed for a given net. In phase two of the claimed method, the constructed initial solution is optimized by using a modified force-directed algorithm to pull inserted flops downstream from initial placements to optimal placements. Each phase of the claimed method is discussed in details below.

(1). Phase One (Constructing an Initial Solution)

Based on the required cycle time and the flop stage constraints, a valid initial solution can be generated bottom-up, i.e., from receiver pins to a driver pin of a net. Starting from a receiver node, assuming a flop is driving each visited node, compute the downstream delay of the child net. Save each of the downstream delay value at each visited node. Insert a flop at an initial placement that is the most upstream node where the downstream delay does not violate cycle time constraint.

If a fan-out node is encountered during the phase one of the claimed method, flop(s) may be forced to be inserted into certain downstream branches to honor the flop stage requirement of each signal path, if given. This can be achieved by comparing the flop stage deficiency d among the downstream branches, and add additional flops to the downstream branches that have higher flop stage deficiency d to match the minimum flop stage deficiency $d_{min}$ among them.

At the end of the phase one, a valid initial solution, i.e., initial flop placements for the net, should be formed. If not, the net cannot be solved based on given constraints. This phase one of the claimed method is also guaranteed to use the minimum number of flops if no flop stages are given for signal paths of the net. The optimal solution (most delay balanced) can be obtained by only moving flops downstream from the initial flop placements to optimal flop placements.

If the flop stage requirements are given for a net, a signal path may not be able to meet its cycle time constraint before running out of required flop stages. In this case, a user may still obtain a delay balanced flop insert solution for the given flop stage requirements by relaxing the cycle time constraint for the net. A relaxed cycle time can be calculated by distributing extra delays across the net.

$$T_{cyc, relaxed} = T_{cyc} + (D_{driver} - T_{cyc})/(MAX(G)+1)$$

where $D_{driver}$ is the worst delay from the driver pin for the failed initial solution.

If a net is assigned with excessive flop stages than it really needs to meet its cycle time constraint, the initial solution generated by the phase one of the claimed method may result in one or more flops close to or at the driver node of the net. Consequentially, the optimization of the undesired initial solution requires many flop movements, which can be improved by using multiple bottom-up initial solution builds. Each time, the cycle time constraint used in the phase one may be reduced by some factor. One idea for the factor is $(MAX(G)-X)/(MAX(G)+T)$ where X is the number of flops close or at the driver node and T is some tolerance. If the reduced cycle time results invalid initial solution, the cycle time used in phase one can be increased again. The search for the adjusted cycle time constraint can be somewhat like a binary search, until a desired initial solution is found.

(2). Phase Two (Optimizing the Initial Solution)

During this phase, a force-directed algorithm is used to pull flops downstream from initial flop placements to optimal flop placements. The initial solution created in phase one should create higher pulling force (delay) on the downstream side. Each flop can be moved into its optimal placement without moving back up. The phase two of the claimed method starts from finding a flop that has the maximum positive delay difference (a downstream delay minus a upstream delay) $D_{dd}=(D_d-D_u)$. Then, move the flop from its initial placement at the current node to its downstream child node(s). Re-compute the upstream delay of the moved flop and save the re-computed upstream delay at each node visited. Downstream delay computation is not needed if it was stored in the nodes from an earlier computation. Repeat this process until no positive delay difference $D_{dd}$ is found and the child net that has the maximum delay is the one driven by the driver pin (assume the marginal difference can be ignored). All flop movements in phase two of the claimed method are only one-way movement—downstream movement.

If the option of using the minimum number of flops for the net is chosen, a flop cannot move down passing a fan-out node in phase two. If the constraint of the minimum number of flops is not given, a flop movement towards downstream nodes from a fan-out node needs to insert a flop at each of the adjacent downstream nodes in all downstream branches. As a result, the number of flops will increase for the net even though each path still has the same number flops. Since the initial solution constructed in phase one already ensure each path has the correct number of flops, it is not necessary to check for this constraint during phase two.

One way to speed up the optimization process of phase two of the claimed invention is to move flops to a further downstream child node, instead of the adjacent downstream child node. Assume a flop has the maximum positive delay difference $D_{dd}$, the flop can be moved to a downstream child node which has a downstream delay $D_d=(D_d+D_U)/2$, as long as the flop movement to this child node does not across a fan-out node.

Figure 2A:
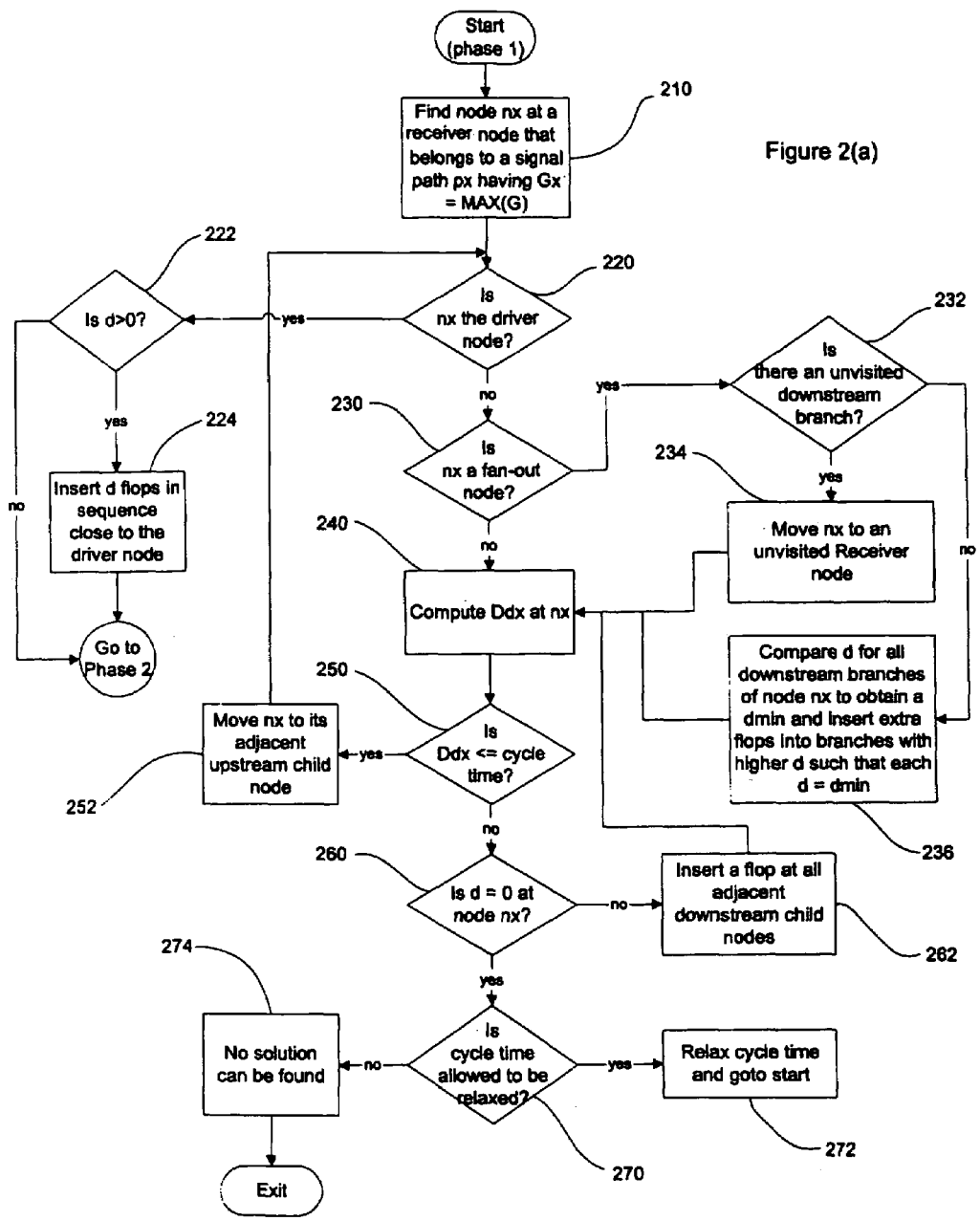
FIG. 2(a)-(b) are functional flow charts illustrating an exemplary method for inserting flops for a net in accordance with one embodiment of the present invention.
Figure 2B:
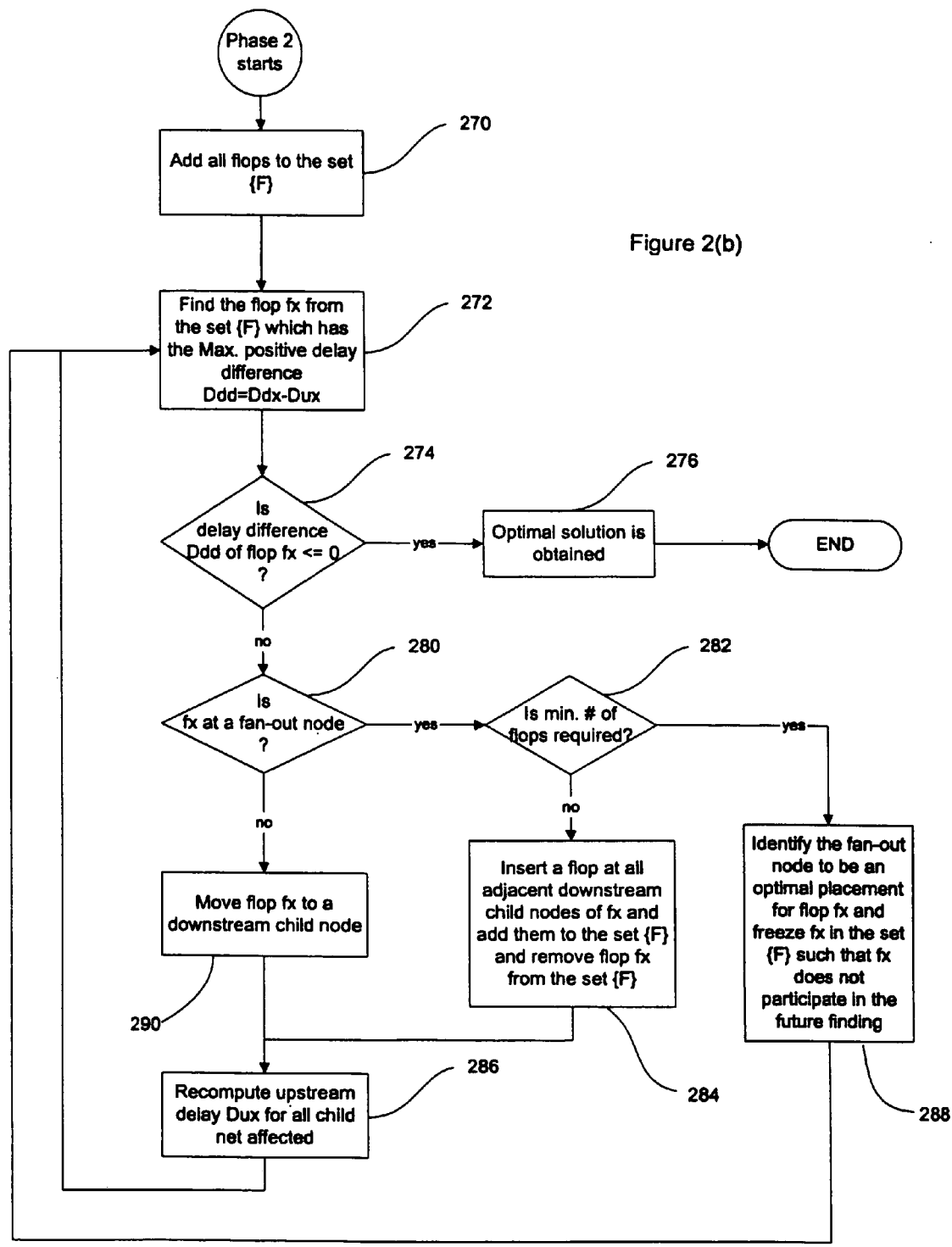

FIG. 2(a)-(b) are flow charts illustrating an exemplary method for inserting flops for a net in accordance with one embodiment of the present invention. FIG. 2(a) shows phase one of the exemplary method, while FIG. 2(b) shows phase two of the exemplary method. Entry condition for the flow chart shown in FIG. 2(a) is that the net has been divided into a plurality of segments by a plurality of nodes. The nodes located at the driver pin and the receiver pins are respectively the driver node and the receiver nodes.

Phase one of the flop insertion method shown in FIG. 2(a) initiates from operation 210 where a node $n_x$ is found at the receiver node that belongs to a signal path $p_x$ having a maximum required flop stage $G_x$. The method advances to operation 220 where node $n_x$ is determined if it is a driver node. If node $n_x$ is not a driver node, the method proceeds to operation 230 where node $n_x$ is determined if it is a fan-out node. If node $n_x$ is determined to be a driver node, the method will move to operation 222 where the flop stage deficiency d of the signal path $p_x$ is checked to see whether the flop stage deficiency d is greater then zero. As mentioned above, the flop stage deficiency of the signal path $p_x$ is obtained by minus the current flop stage g from the required flop stage G. If the flop stage deficiency d for the signal path $p_x$ is greater than 0, d number of flops are inserted in sequence close to the driver node of the signal path $p_x$, i.e., the output of the Driver Pin will be connected to the input of the first inserted flop, and the output of the first inserted flop will be connected to the input of the second inserted flop, and etc. If the flop stage deficiency d is not greater than zero, the method will proceed to phase two of the exemplary flop insertion method.

In operation 230, if node $n_x$ is determined not to be a fan-out node, the method will advance to operation 240 where the downstream delay $D_{dx}$ at node $n_x$ is computed. In one embodiment, the computed downstream delay $D_{dx}$ is saved at node $n_x$. The computed downstream delay $D_{dx}$ is checked in operation 250 to determine whether $D_{dx}$ is less than or equal to the required cycle time. If $D_{dx}$ is less than the required cycle time, move node $n_x$ to its adjacent upstream child node in operation 252, and then go back to operation 220. If $D_{dx}$ is greater than the required cycle time, the flop stage deficiency d for the signal path $p_x$ is checked in operation 260 to see if d is equal to zero at node $n_x$. If the flop stage deficiency d is zero, i.e., all the assigned flops for the signal path $p_x$ are used up, then, in operation 270, it needs to be determined if the cycle time constraint can be relaxed. If the cycle time constraint cannot be relaxed, no initial flop insert solution for the given cycle time constraint can be found for the signal path $p_x$, the operation of the method will be terminated. Otherwise, relax the required cycle time in operation 272 and start from operation 210 again.

If node $n_x$ is determined in operation 230 to be a fan-out node, other signal paths branched out from this fan-out node will be checked in operation 232 to see whether any unvisited downstream branches exist. An unvisited downstream branch is a path without any flop insertions implemented by phase one of the exemplary flop insertion method. If an unvisited downstream branch is found, node $n_x$ will be moved to the receiver node of the unvisited downstream branch. Then the method will go back to operation 240. If all downstream branches branched out from this fan-out node are visited, all flop stage deficiencies of all downstream branches branched out from the fan-out node (currently node $n_x$) are compared in operation 236 to find a minimum flop stage deficiency $d_{min}$. Then, insert additional flops to the downstream branches that have higher flop stage deficiencies such that each flop stage deficiency is equal to minimum flop stage deficiency $d_{min}$. Thereafter, the method will move from operation 236 to operation 240.

In operation 260, if the flop stage deficiency d at node $n_x$ is not zero, the method will proceed to operation 262 where a flop is inserted at all downstream child nodes which are adjacent to node $n_x$. The method will then go back to operation 240.

Phase two of the exemplary flop insertion method shown in FIG. 2(b) starts from operation 270 where all of the flops of the net are added to the set {F}. The method then proceeds to operation 272 where flop $f_x$ which has the maximum positive delay difference ($D_{dx}-D_{ux}$) is found from the set {F}. The delay difference of flop $f_x$ is checked in operation 274 to determining whether the delay difference $D_{dd}$ is greater than zero. If the delay difference $D_{dd}$ of flop $f_x$ is determined to be equal to or less than zero, the optimal solution for the flop insertion is achieved (operation 276) and the flop insertion method ends. Otherwise, flop $f_x$ is checked in operation 280 to determined whether flop $f_x$ is at a fan-out node. If flop $f_x$ is located at a fan-out node and a minimum number of flops requirement is set for the net, in operation 288, flop $f_x$ will remain at the fan-out node and the fan-out node is identified to be the optimal placement for flop $f_x$. Furthermore, flop $f_x$ is frozen in set {F} such that flop $f_x$ does not participate in the future operation of 272. The flop insertion method then goes back to operation 272 until an optimal solution for the flop insertion is found.

If flop $f_x$ is located at a fan-out node and the net has no minimum number of flops requirement, a flop is inserted at each of the adjacent downstream child nodes in operation 284. The inserted flops at each of the adjacent downstream child nodes are added to the set {F}, and flop $f_x$ is removed from the set {F}. Then, phase two of the flop insertion method advances to operation 286 where the upstream delays for all affected child net are recomputed, phase two of the method then goes back to operation 272 until an optimal solution for the flop insertion is found. If, in operation 280, it is determined that flop $f_x$ is not located at a fan-out node, flop $f_x$ is moved to a downstream child node in operation 290, and the method will proceed to operation 286.

FIG. 3(a)-(d) illustrate an exemplary method for inserting flops for a net 300 in accordance with one embodiment of the present invention. The net 300 starts from the driver pin 310 and ends at the receiver pin 320. The required flop stage G for the net 300 is 2, and the required cycle time $T_{cycle}$ for the net 300 is 3 delay units. The net 300 is divided into six segments {$s_1, s_2, \ldots, s_6$} by seven nodes {$n_1, n_2, \ldots, n_7$}, wherein node $n_1$ and node $n_7$ are respectively the driver node and the receiver node. For the simplicity of illustration, in this embodiment, each segment represents one delay unit.

Figure 3A:
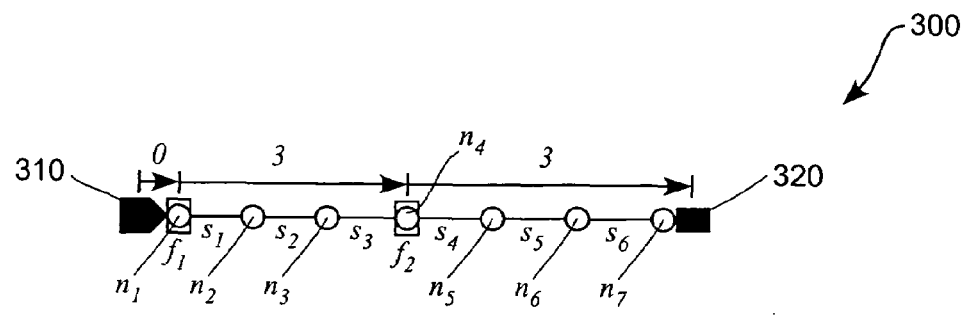
FIG. 3(a)-(d) illustrate an exemplary method for inserting flops for a net in accordance with one embodiment of the present invention.

As shown in FIG. 3(a), a valid initial solution is generated bottom-up during phase one of the exemplary method, i.e., two flops $f_1$ and $f_2$ are inserted into the net 300 according to the cycle time and flop stage constraints ($T_{cycle}$=3, G=2). As illustrated, the upstream delays $D_{u1}$ and $D_{u2}$ for flop $f_1$ and flop $f_2$ are 0 and 3, and the downstream delays $D_{d1}$ and $D_{d2}$ for flop $f_1$ and flop $f_2$ are 3, respectively.

Figure 3B:
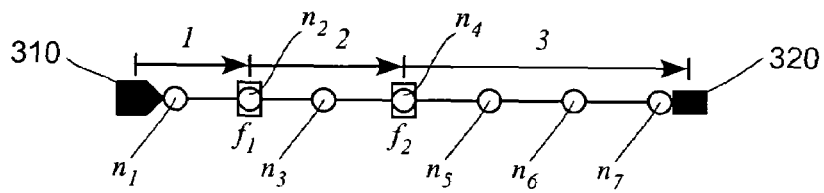
Figure 3C:
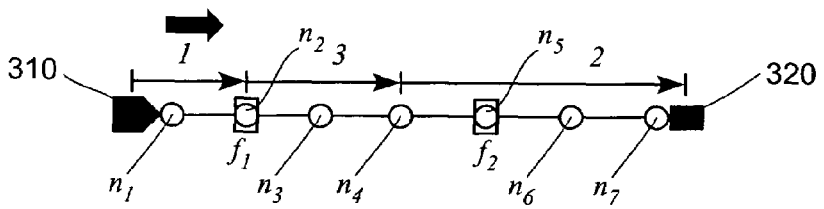
Figure 3D:
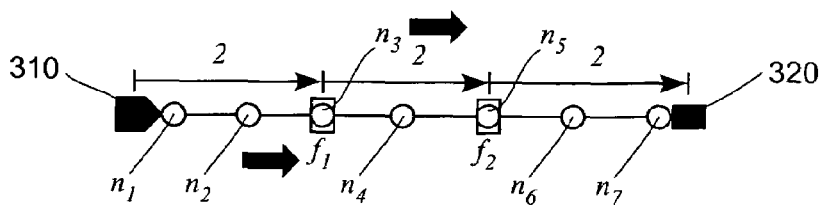

Then, phase two of the exemplary method, i.e., the optimization for the initial solution starts from FIG. 3(b). Between the two flops $f_1$ and $f_2$, flop $f_1$ has the maximum positive delay difference $D_{dd1}=D_{d1}-D_{u1}=3$, while the delay difference $D_{dd2}$ for flop $f_2$ is 0. Because $D_{dd1}$ is greater than $D_{dd2}$, flop $f_1$ needs to be moved from its current initial placement at node $n_1$ (driver node) to its adjacent downstream child node $n_2$, as illustrated in FIG. 3(b). After the downstream move of flop $f_1$, the delay difference $D_{dd1}$ for flop $f_1$ is 2−1=1, the delay difference $D_{dd2}$ for flop $f_2$ is 3−2=1.

According to phase two of the exemplary flop insertion method, the positive delay differences $D_{dd1}$ and $D_{dd2}$ for flops $f_1$ and $f_2$ need to be zero or less. Due to $D_{dd1}=D_{dd2}$ in FIG. 3(b), either flop $f_1$ or flop $f_2$ can be chosen to be moved downstream first. In this example, flop $f_2$ is moved downstream first from node $n_4$ to node $n_5$ in FIG. 3(c), and then flop $f_1$ is moved downstream from node $n_2$ to node $n_3$ in FIG. 3(d) such that the delay differences $D_{dd1}$ and $D_{dd2}$ for flops $f_1$ and $f_2$ are zero.

FIG. 4(a)-(g) illustrate an exemplary method for inserting flops for a net 400 in accordance with one embodiment of the present invention. The net 400 starts from the driver pin 410 and ends at the receiver pin 420 and the receiver pin 430, respectively. The net 400 contains two signal paths $P_1$ and $P_2$, while $P_1=\{s_1, s_2, s_3, \ldots, s_{12}\}$ and $P_2=\{s_1, s_2, s_{13}, s_{14}, s_{15}\}$. Node $n_3$ is a fan-out node from where two downstream branches $\{s_{13}, s_{14}, s_{15}\}$ $\{s_3, s_4, s_5, \ldots, s_{12}\}$ are branched out. For the net 400, the cycle time constraint $T_{cycle}=4$, and the required flop stages for signal paths $P_1$ and $P_2$ are respectively $G_{p1}=3$ and $G_{p2}=2$.

Figure 4A:
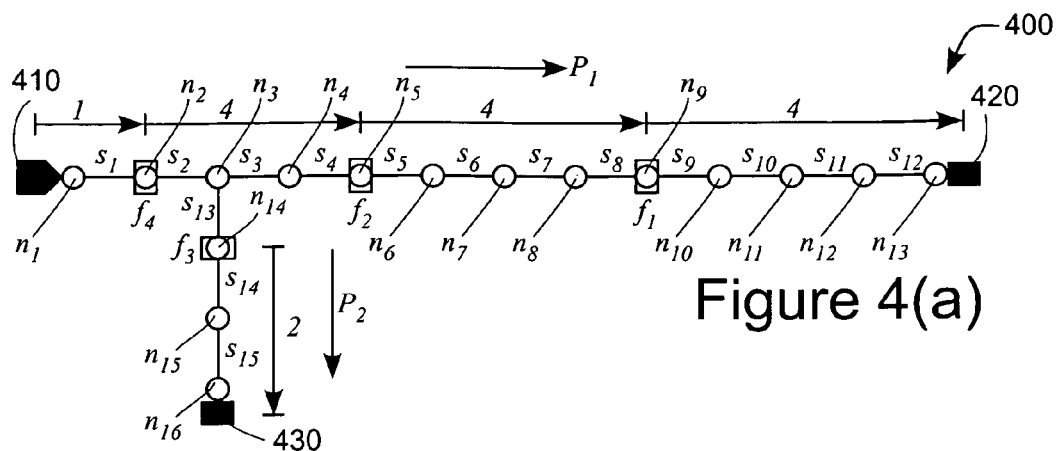
FIG. 4(a)-(g) illustrate an exemplary method for inserting flops for a net in accordance with one embodiment of the present invention.

As shown in FIG. 4(a), the initial solution is constructed bottom-up with respect to the required cycle time and flop stage constraints. Since the signal path $P_1$ has the maximum required flop stage $G_{p1}=3$, the signal path $P_1$ is chosen for flop insertions first. According to phase one of the claimed method, flops need to be inserted in a signal path such that each downstream delay is equal to or less than the required cycle time. As illustrated in FIG. 4(a), the downstream delays for flop $f_1$ and flop $f_2$ are equal to the required cycle time $T_{cycle}=4$. When the fan-out node $n_3$ is visited for the signal path $P_1$, the other signal path $P_2$ needs to be visited starting from its receiver node, node $n_{16}$. When node $n_3$ is visited again from the signal path $P_2$, the flop stage deficiencies for both downstream branches are checked. Thus, the flop stage deficiency $d_{p1}$ for the downstream branch of signal path $P_1$ is 3-2=1, while the flop stage deficiency $d_{p2}$ for downstream branch of signal path $P_2$ is 2-0=0. Therefore, flop f3 needs to be inserted in node n14 such that the flop stage deficiency $d_{p2}$ (2-1=1) matches the flop stage deficiency $d_{p1}$.

As shown, four flops $f_1, f_2, f_3$, and $f_4$ are inserted into the net 400, wherein flop $f_4$ is shared by both signal paths $P_1$ and $P_2$. Although the signal path $P_2$ is a short path, the insertion of flop $f_3$ is still mandated by the required flop stage constraint $G_{p2}$ even though the downstream delay $D_{d3}$ of flop $f_3$ is less than the cycle time constraint $T_{cycle}$. Thus, flop $f_3$ is positioned in node $n_{14}$, which is the adjacent downstream node to the fan-out node $n_3$, in order to have a downstream delay $D_{d3}$ that is closest to the cycle time constraint $T_{cycle}$.

After the initial valid solution in FIG. 4(a), the delay differences for flops $f_1, f_2, f_3$, and $f_4$ are respectively 0, 0, -2, and 3. Therefore, flop $f_4$ has the maximum positive delay difference (4-1=3).

Figure 4B:
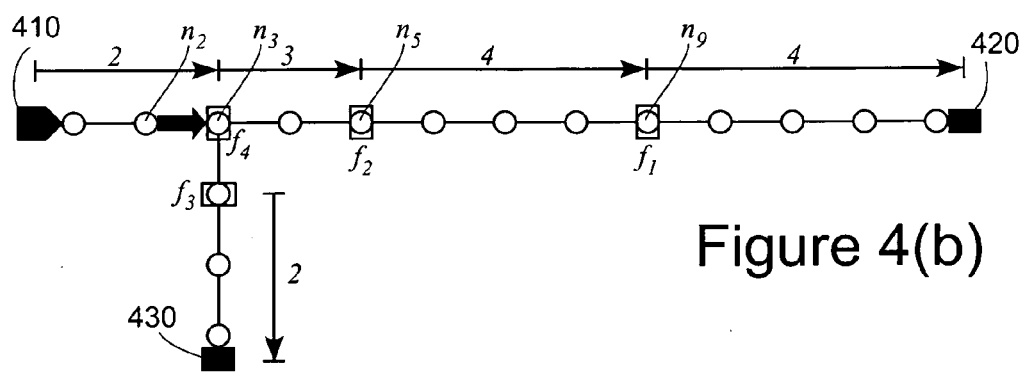

In FIG. 4(b), flop $f_4$, which has the maximum positive delay difference, is moved to its adjacent downstream child node, the fan-out node $n_3$. After the flop movement, the positive delay difference $D_{dd4}$ for flop $f_4$ is 3-2=1, and the positive delay differences for flop $f_1, f_2$, and $f_3$ are 0, 1, and -1, respectively. Although the positive delay difference $D_{dd4}$ for flop $f_4$ is still positive 1, flop $f_4$ cannot be moved any further downstream due to the flop stage constraints $G_{p1}=3$ and $G_{p2}=2$. Among flops $f_1, f_2$, and $f_3$, flop $f_2$ has the maximum delay difference $D_{dd2}=1$.

Figure 4C:
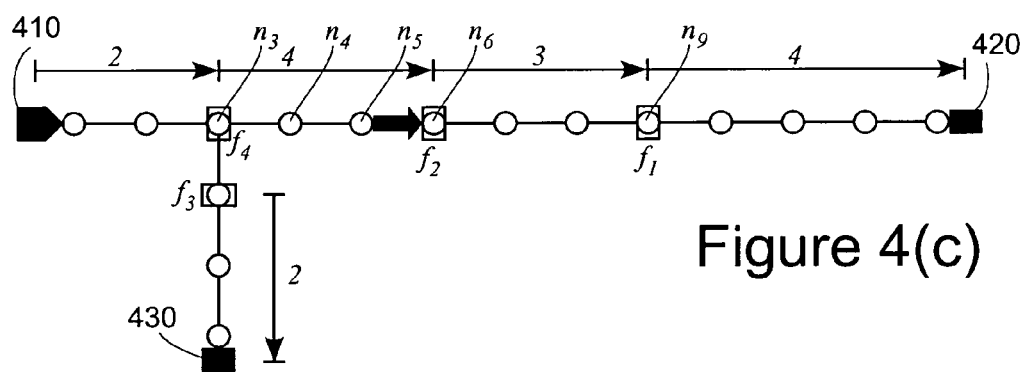
Figure 4D:
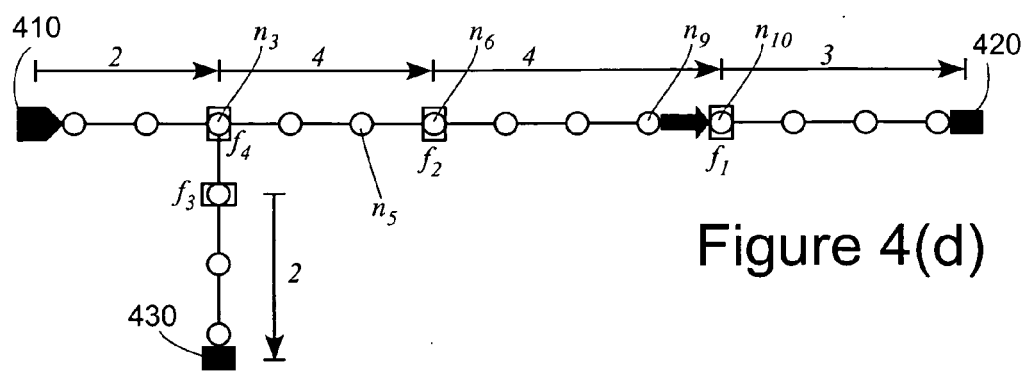

As shown in FIG. 4(c), flop $f_2$ is moved downstream from node $n_5$ to node $n_6$ in order to have a non-positive delay difference. Consequently, flop $f_1$ has a positive delay difference $D_{dd1}=4-3=1$ after the movement of flop $f_2$. Although the positive delay difference Ddd4 for flop f4 is still positive 1, flop f4 may not be moved any further downstream if the minimum number of flops option is chosen. Among flops f1, f2, and f3, flop f2 has the maximum delay difference Ddd2=1.

Figure 4E:
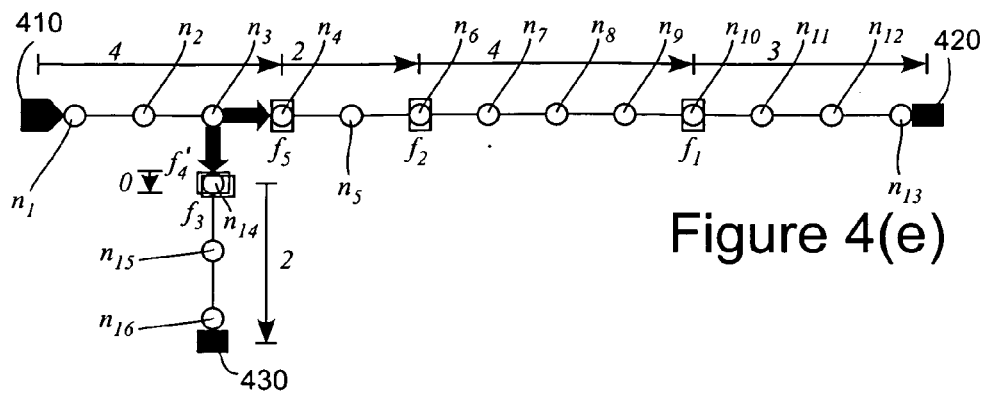

For the net 400, if the objective is to get the most balanced delay for the flop insertion regardless the number of flops used, flop $f_4$ can be moved further downstream to pass the fan-out node $n_3$ and split into two flops $f_4'$ and $f_5$. As shown in FIG. 4(e), after flop $f_4$ is split into two flops $f_4'$ and $f_5$, the delay differences for flops $f_1, f_2, f_3, f_4'$, and $f_5$ are -1, 2, 2, -4, and -2, respectively. Since both flop $f_2$ and flop $f_3$ have the maximum positive delay difference $D_{dd2}=D_{dd3}=2$, either flop $f_2$ or flop $f_3$ can be chosen to be optimized first.

Figure 4F:
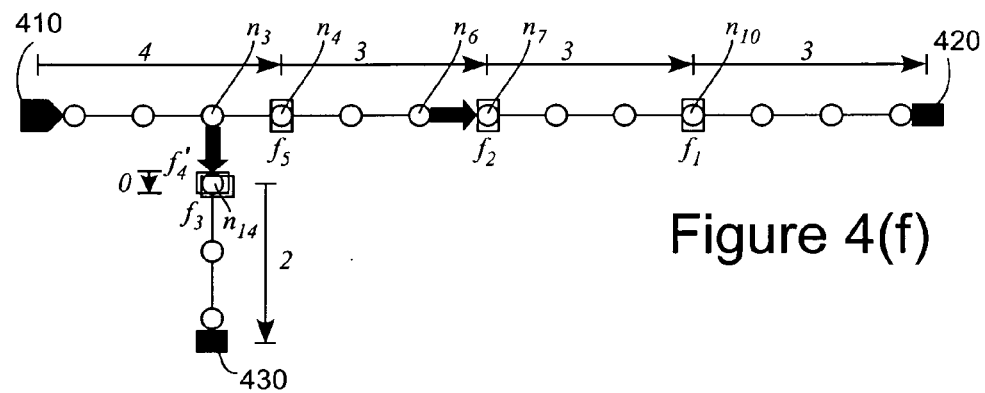
Figure 4G:
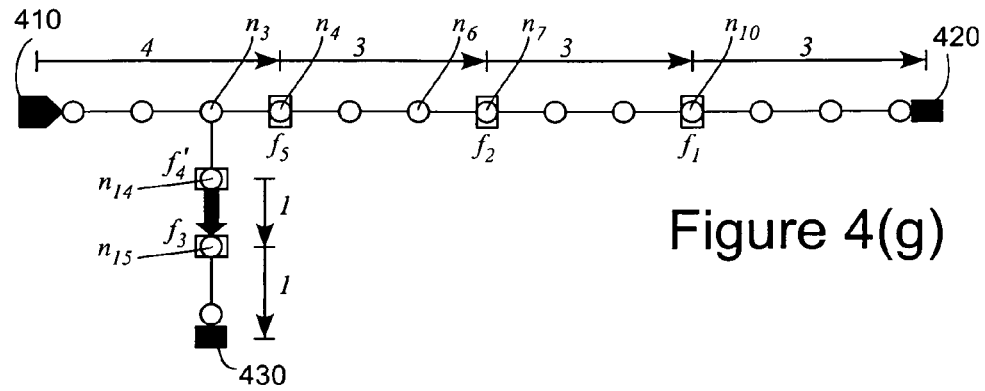

In FIG. 4(f), flop $f_2$ is moved downstream from node $n_6$ to node $n_7$ in order to reduce its delay difference $D_{dd2}$ from positive 2 to 0. Next, as shown in FIG. 4(g), flop $f_3$ is moved downstream from node $n_{14}$ to node $n_{15}$ to obtain a non-positive delay difference $D_{dd3}=1-1=0$. FIG. 4(g) shows the final layout of the flop insertion for the net 400. The final delay differences for flops $f_1, f_2, f_3$, and $f_4$ are respectively 0, 0, 0, -3, and -1.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching.

Furthermore the invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

The embodiments were chosen and described in order to explain the principles and the application of the invention, thereby enabling others skilled in the art to utilize the invention in its various embodiments and modification s according to the particular purpose contemplated. The scope of the invention is intended to be defined by the claims appended hereto and their equivalents.

What is claimed is:

1. A method for inserting flip-flop (flop) in an interconnect (net) between logic blocks of an integrated circuit design to ensure that a cycle time constraint for the net is satisfied, comprising:

inserting a flop at an initial placement at a node along a signal path of the net such that a downstream delay relative to the initial placement of the flop is not greater than the cycle time constraint for the net; and optimizing the initial placement of the flop by moving the flop from the initial placement to an optimal placement at a downstream node such that a delay difference, of a downstream delay minus an upstream delay, relative to the optimal placement is not greater than a number zero, wherein the optimal placement of the flop is derived by moving the flop downstream from the initial placement to one or more preliminary optimal placements at one or more nodes located downstream from the initial placement of the flop and upstream from the optimal placement of the flop, wherein at each preliminary optimal placement determining whether each delay difference relative to each preliminary optimal placement is not greater than number zero, and if a delay difference relative to a preliminary optimal placement at a node is greater than a number zero, moving the flop to a next preliminary optimal placement at an adjacent downstream node, else identifying the node to be the optimal placement of the flop.

2. The method for inserting flip-flop (flop) in an interconnect (net) as recited in claim 1, wherein a first preliminary placement occurring at a receiver node and the one or more preliminary placements occurring at nodes located upstream from the receiver node and downstream from the initial placement.

3. The method for inserting flip-flop (flop) in an interconnect (net) as recited in claim 2, further comprising, determining, at each preliminary placement, whether each downstream delay relative to each preliminary placement is not greater than the cycle time constraint for the net; and if a downstream delay relative to a preliminary placement is not greater than the cycle time constraint,
   proceeding to a next preliminary placement at an adjacent upstream node; else
   identifying an adjacent downstream node to be the initial placement of the flop.

4. The method for inserting flip-flop (flop) in an interconnect (net) as recited in claim 1, wherein the inserting of the flop and the optimizing of the initial placement of the flop are performed on a simulation of the net.

5. A method for inserting flip-flop (flop) in an interconnect (net) between logic blocks of an integrated circuit design to ensure that a cycle time constraint for the net and each flop stage requirement for each signal path of the net are satisfied, comprising:

inserting flops at initial placements along each signal path of the net such that each downstream delay relative to each initial placement of each flop is not greater than the cycle time constraint for the net, and a number of flops inserted at each signal path satisfies each flop stage requirement for each signal path of the net; and optimizing the initial placements of the flops by moving the flops downstream such that each delay difference, defined by a downstream delay minus an upstream delay, relative to each optimal placement of each flop is not greater than a number zero; and wherein each initial placement of each inserted flop is derived by one or more preliminary placements at nodes along each signal path of the net, a first preliminary placement of each signal path occurring at each receiver node of each signal path and the one or more preliminary placements occurring at nodes located upstream from each receiver node and downstream from each initial placement of each inserted flop, and after the inserting of the flops, one of inserted flops which has a maximum positive delay difference is chosen to be optimized first.

6. The method for inserting flip-flop (flop) in an interconnect (net) as recited in claim 5, further comprising, determining, at each preliminary placement, whether each downstream delay relative to each preliminary placement is not greater than the cycle time constraint for the net; and if a downstream delay relative to a preliminary placement of a flop is not greater than the cycle time constraint,
   proceeding to a next preliminary placement at an adjacent upstream node; else
   identifying an adjacent downstream node to be an initial placement of the flop.

7. The method for inserting flip-flop (flop) in an interconnect (net) as recited in claim 6, further comprising, determining whether each flop stage deficiency of each signal path is equal to a number zero before the identifying of an adjacent downstream node to be an initial placement of the flop; and if each flop stage deficiency of each signal path is a number zero,
   relaxing the cycle time constraint for the net if allowed.

8. The method for inserting flip-flop (flop) in an interconnect (net) as recited in claim 5, further comprising, determining, at each preliminary placement, whether each preliminary placement is located at a fan-out node; and if a preliminary placement is located at a fan-out node,
   determining whether an unvisited downstream branch branched out from the fan-out node exists,
   if the unvisited downstream branch exists,
      proceeding to a receiver node of the unvisited downstream branch;
      inserting flops at initial placements along the unvisited downstream branch;
   else
      finding a minimum flop stage deficiency of a downstream branch branched out from the fan-out node;
      inserting additional flops into other downstream branches that have higher flop stage deficiencies than the minimum flop stage deficiency such that each flop stage deficiency of each downstream branch branched out from the fan-out node is equal to the minimum flop stage deficiency.

9. The method for inserting flip-flop (flop) in an interconnect (net) as recited in claim 5, wherein each optimal placement of each flop is derived by moving each flop downstream from each initial placement to one or more preliminary optimal placements at one or more child nodes located downstream from each initial placement of each flop and upstream from each optimal placement of each flop.

10. The method for inserting flip-flop (flop) in an interconnect (net) as recited in claim 5, wherein one of signal paths of the net which has a maximum flop stage requirement is chosen for the inserting of the flops.

11. The method for inserting flip-flop (flop) in an interconnect (net) as recited in claim 5, wherein the flops inserted for the net are of a same type of flops.

* * * * *